US010453725B2

(12) United States Patent
Wirth

(10) Patent No.: US 10,453,725 B2
(45) Date of Patent: Oct. 22, 2019

(54) DUAL-BLADE ROBOT INCLUDING VERTICALLY OFFSET HORIZONTALLY OVERLAPPING FROG-LEG LINKAGES AND SYSTEMS AND METHODS INCLUDING SAME

(71) Applicant: Applied Materials, Inc., Santa Clara, CA (US)

(72) Inventor: Paul Z. Wirth, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/708,806

(22) Filed: Sep. 19, 2017

(65) Prior Publication Data
US 2019/0088530 A1    Mar. 21, 2019

(51) Int. Cl.
*H01L 21/677* (2006.01)
*B25J 9/10* (2006.01)
*B25J 11/00* (2006.01)
*B25J 9/00* (2006.01)

(52) U.S. Cl.
CPC ...... *H01L 21/67742* (2013.01); *B25J 9/0087* (2013.01); *B25J 9/107* (2013.01); *H01L 21/67745* (2013.01); *B25J 11/0095* (2013.01)

(58) Field of Classification Search
CPC ......... H01L 21/67742; H01L 21/67745; H01L 21/67748; B25J 9/0087; B25J 9/107; B25J 11/0095; B25J 18/005
USPC ............................................ 414/744.5, 744.6
See application file for complete search history.

(56) References Cited

U.S. PATENT DOCUMENTS

| 5,180,276 A | * | 1/1993 | Hendrickson | ............ | B25J 9/107 |
| | | | | | 414/744.5 |
| 5,447,409 A | | 9/1995 | Grunes et al. | | |
| 5,647,724 A | | 7/1997 | Davis, Jr. et al. | | |
| 5,789,878 A | * | 8/1998 | Kroeker | ............ | B25J 9/107 |
| | | | | | 318/45 |
| 6,056,504 A | | 5/2000 | Hudgens et al. | | |

(Continued)

FOREIGN PATENT DOCUMENTS

| JP | 2007-019216 | | 1/2007 | | |
| WO | WO-2006137370 A1 | * | 12/2006 | ............ | B25J 9/107 |

OTHER PUBLICATIONS

Muthukamatchi et al., U.S. Appl. No. 15/619,424, titled "Dual Robot Including Spaced Upper Arms and Interleaved Wrists and Systems and Methods Including Same," filed Jun. 9, 2017.

(Continued)

*Primary Examiner* — James Keenan
(74) *Attorney, Agent, or Firm* — Lowenstein Sandler LLP

(57) ABSTRACT

A dual-blade robot having overlapping frog-leg linkages is disclosed. The robot includes first and second arms, coplanar with each other and each rotatably coupled to a first blade, in a frog-leg configuration, and third and fourth arms, coplanar with each other and each rotatably coupled to a second blade, in a frog-leg configuration, where the third and fourth arms are vertically offset from the first and second arms. The third and fourth arms are configured to overlap at least a portion of the first and second arms when the first and second blades are in a retracted position. Methods of operating the robot and electronic device processing systems including the robot are provided, as are numerous other aspects.

19 Claims, 8 Drawing Sheets

(56) References Cited

U.S. PATENT DOCUMENTS

| | | | |
|---|---|---|---|
| 6,102,164 A * | 8/2000 | McClintock | H01L 21/67742 |
| | | | 187/267 |
| 6,132,165 A | 10/2000 | Carducci | |
| 6,155,131 A | 12/2000 | Suwa et al. | |
| 6,267,549 B1 * | 7/2001 | Brown | B25J 9/107 |
| | | | 414/744.5 |
| 6,382,902 B1 * | 5/2002 | Sugimura | B25J 9/107 |
| | | | 118/719 |
| RE37,731 E * | 6/2002 | Ogawa | B25J 9/107 |
| | | | 414/744.5 |
| 6,988,867 B2 * | 1/2006 | Saeki | B25J 9/107 |
| | | | 414/744.5 |
| 7,201,078 B2 * | 4/2007 | Byun | B25J 9/107 |
| | | | 74/490.03 |
| 7,688,017 B2 | 3/2010 | Hudgens | |
| 7,927,062 B2 | 4/2011 | Rice et al. | |
| 8,016,542 B2 | 9/2011 | Cox et al. | |
| 8,061,232 B2 | 11/2011 | Kroetz et al. | |
| 8,264,187 B2 | 9/2012 | Laceky et al. | |
| 8,692,500 B2 | 4/2014 | Laceky et al. | |
| 8,777,547 B2 | 7/2014 | Kremerman et al. | |
| 8,784,033 B2 | 7/2014 | Kremerman et al. | |
| 9,346,171 B2 * | 5/2016 | Watanabe | B25J 9/107 |
| 9,764,465 B2 * | 9/2017 | Iura | B25J 9/107 |
| 2001/0033788 A1 * | 10/2001 | Pietrantonio | B25J 9/107 |
| | | | 414/744.5 |
| 2002/0061248 A1 * | 5/2002 | Tepman | C23C 14/568 |
| | | | 414/744.5 |
| 2003/0035709 A1 | 2/2003 | Cox et al. | |
| 2009/0022571 A1 | 1/2009 | Krupyshev et al. | |
| 2012/0087766 A1 | 4/2012 | Hiroki | |
| 2012/0107072 A1 * | 5/2012 | Watanabe | B25J 9/107 |
| | | | 414/222.01 |
| 2013/0115028 A1 | 5/2013 | Kremerman et al. | |
| 2013/0149076 A1 | 6/2013 | Cox et al. | |
| 2013/0272823 A1 | 10/2013 | Hudgens et al. | |
| 2014/0010625 A1 | 1/2014 | Hudgens et al. | |
| 2014/0150592 A1 | 6/2014 | Kremerman | |
| 2014/0154038 A1 | 6/2014 | Hudgens et al. | |
| 2014/0271055 A1 | 9/2014 | Weaver et al. | |
| 2014/0286736 A1 | 9/2014 | Kremerman et al. | |
| 2014/0286741 A1 | 9/2014 | Kremerman et al. | |
| 2015/0098790 A1 * | 4/2015 | Wakabayashi | H01L 21/67742 |
| | | | 414/805 |
| 2015/0190933 A1 | 7/2015 | Kremerman | |
| 2017/0117171 A1 | 4/2017 | Wirth | |

OTHER PUBLICATIONS

International Search Report & Written Opinion of International Application No. PCT/US2018/050297 dated Jan. 2, 2019.

\* cited by examiner

DUAL-BLADE ROBOT INCLUDING VERTICALLY OFFSET HORIZONTALLY OVERLAPPING FROG-LEG LINKAGES AND SYSTEMS AND METHODS INCLUDING SAME

FIELD

Embodiments of the present disclosure relate to electronic device manufacturing, and more specifically to robots adapted to transport substrates between chambers.

BACKGROUND

Electronic device manufacturing systems may include process tools having multiple chambers, such as process chambers and one or more load lock chambers. Such process chambers and one or more load lock chambers may be included in a cluster tool, for example, where substrates may be transported between the respective process chambers and the one or more load lock chambers. These systems may employ one or more robots to move the substrates between the various chambers, and the one or more robots may reside in a transfer chamber in some embodiments. During such movements, a substrate may be supported on an end effector (sometimes referred to as a "blade") of the one or more robots.

The process chambers of an electronic device manufacturing system, such as cluster tool, may be used to carry out any number of processes on the substrates (e.g., silicon-containing wafers, both patterned and unpatterned, masked wafers, glass plates, silica-containing articles, or the like) such as deposition, oxidation, nitridation, etching, polishing, cleaning, lithography, metrology, or the like.

Within such process and/or cluster tools, a plurality of chambers may be distributed about a transfer chamber, for example. A robot may be housed within the transfer chamber and may be configured and adapted to transport substrates between the various chambers. For example, transfers may be between process chambers, or between process chambers and one or more load lock chambers. Slit valves may be located at the entries into each respective chamber to allow each chamber to be environmentally isolated.

Robot apparatus, system and method designs that improve operation and/or efficiency of process and/or cluster tool operation are beneficial.

SUMMARY

In a first example embodiment, a dual-blade robot, includes a first frog-leg linkage coupled to a first blade and configured to extend the first blade in a first direction; and a second frog-leg linkage coupled to a second blade and configured to extend the second blade in a second direction, wherein the second frog-leg linkage is vertically offset from the first frog-leg linkage such that the second frog-leg linkage overlaps the first frog-leg linkage when the first blade and the second blade are each in a retracted position.

In a second example embodiment, a cluster tool, includes a transfer chamber, a load lock coupled to the transfer chamber, a process chamber coupled to the transfer chamber, and a dual-blade robot disposed within the transfer chamber, the dual-blade robot having a first frog-leg linkage and a second frog-leg linkage, wherein the second frog-leg linkage is vertically offset from the first frog-leg linkage, and the second frog-leg linkage overlaps the first frog-leg linkage when the first frog-leg linkage and the second frog-leg linkage are each in a retracted position.

In a third example embodiment, a method of transferring a substrate between a first chamber and a second chamber, includes, extending a first frog-leg linkage such that a first blade of a dual-blade robot coupled to the first frog-leg linkage is positioned in the first chamber, retrieving a substrate from the first chamber, and retracting the first frog-leg linkage such that the first blade exits the first chamber with the substrate on the first blade, wherein the first frog-leg linkage overlaps a second frog-leg linkage of the dual-blade robot after the retracting of the first frog-leg linkage from the first chamber.

In an alternative example embodiment, a robot includes a hub having a first axis, a first member and a second member each rotatably coupled to the hub and rotatable about the first axis, a first arm having a first end and a second end, the first end of the first arm rotatably coupled to the first member and rotatable about a second axis, the second end of the first arm rotatably coupled to a first blade and rotatable about a third axis, a second arm having a first end and a second end, the first end of the second arm rotatably coupled to the second member and rotatable about a fourth axis, the second end of the second arm rotatably coupled to the first blade and rotatable about a fifth axis, a third arm having a first end and a second end, the first end of the third arm rotatably coupled to the second member and rotatable about a sixth axis, the second end of the third arm rotatably coupled to a second blade and rotatable about the third axis, and a fourth arm having a first end and a second end, the first end of the fourth arm rotatably coupled to the first member and rotatable about a seventh axis, the second end of the fourth arm rotatably coupled to the second blade and rotatable about the fifth axis, wherein the first arm is nominally coplanar with the second arm, the third arm is nominally coplanar with the fourth arm, and the third and fourth arms are vertically offset from the first and second arms respectively.

In another alternative example embodiment, a system includes, a first chamber defining a volume, a dual-blade robot disposed within the volume defined by the first chamber, the dual-blade robot including a hub having a first axis, a first member and a second member each rotatably coupled to the central hub and rotatable about the first axis, a first arm having a first end and a second end, the first end of the first arm rotatably coupled to the first member at a second axis, the second end of the first arm rotatably coupled to a first blade at a third axis, a second arm having a first end and a second end, the first end of the second arm rotatably coupled to the second member at a fourth axis, the second end of the second arm rotatably coupled to the first blade at a fifth axis, a third arm having a first end and a second end, the first end of the third arm rotatably coupled to the second member at a sixth axis, the second end of the third arm rotatably coupled to a second blade at the third axis, a fourth arm having a first end and a second end, the first end of the fourth arm rotatably coupled to the first member at a seventh axis, the second end of the fourth arm rotatably coupled to the second blade at the fifth axis, wherein the first arm is nominally coplanar with the second arm, the third arm is nominally coplanar with the fourth arm, and the third and fourth arms are vertically offset from the first and second arms respectively.

In a still further alternative example embodiment, a cluster tool includes a transfer chamber, a load lock coupled to the transfer chamber, a process chamber coupled to the transfer chamber, a dual-blade wafer-handling robot disposed within the transfer chamber, the dual-blade wafer-handling robot having a frog-leg cross linkage, wherein the frog-leg cross linkage includes a first arm having a first end and a second end, the first end of the first arm rotatably coupled to a first member and rotatable about a first axis, the second end of the first arm rotatably coupled to a first blade and rotatable about a second axis, a second arm having a first end and a second end, the first end of the second arm rotatably coupled to a second member and rotatable about a third axis, the second end of the second arm rotatably coupled to the first blade and rotatable about a fourth axis, a third arm having a first end and a second end, the first end of the third arm rotatably coupled to the second member and rotatable about a fifth axis, the second end of the third arm rotatably coupled to a second blade and rotatable about the second axis, a fourth arm having a first end and a second end, the first end of the fourth arm rotatably coupled to the first member and rotatable about a sixth axis, the second end of the fourth arm rotatably coupled to the second blade and rotatable about the fourth axis, wherein the first arm is nominally coplanar with the second arm, the third arm is nominally coplanar with the fourth arm, and the third and fourth arms are vertically offset from the first and second arms respectively.

Numerous other features are provided in accordance with these and other embodiments of the disclosure. Other features and aspects of embodiments of the disclosure will become more fully apparent from the following detailed description, the accompanying drawings, and the subjoined claims.

DETAILED DESCRIPTION

Various embodiments in accordance with the present disclosure provide a dual-blade robot that includes a first frog-leg linkage and a second frog-leg linkage configured such that the second frog-leg linkage is vertically offset from the first frog-leg linkage, and further configured such that the second frog-leg linkage horizontally overlaps the first frog-leg linkage when the blades of the dual-blade robot are retracted. Such a configuration reduces the overall footprint of the dual-blade robot when the blades are retracted, and allows use of longer blades than would otherwise be usable within a transfer chamber housing the dual-blade robot. For example, in some embodiments, relatively long and/or high temperature blades, such as quartz blades, may be employed to place substrates within or remove substrates from a process chamber that performs high temperature processing (e.g., an epitaxial growth and/or deposition chamber). To avoid exposing a portion of the dual-blade robot, such as a wrist portion, to the high temperature environment of the process chamber, a long blade may be employed so that only the blade extends into the process chamber during substrate placement or removal. In a dual-blade robot configuration in which blades extend in opposite directions, the use of long blades may increase the overall footprint of the dual-blade robot so that the robot no longer fits within the transfer chamber. Embodiments described herein provide dual-blade robots, systems and methods that allow the use of longer blades while maintaining an overall (retracted) footprint suitable for use within a transfer chamber.

Further details of various aspects of the robot, electronic device processing systems including the robot, and methods of operating the robot according to example embodiments are described with reference to FIGS. 1A-4.

Figure 1A:
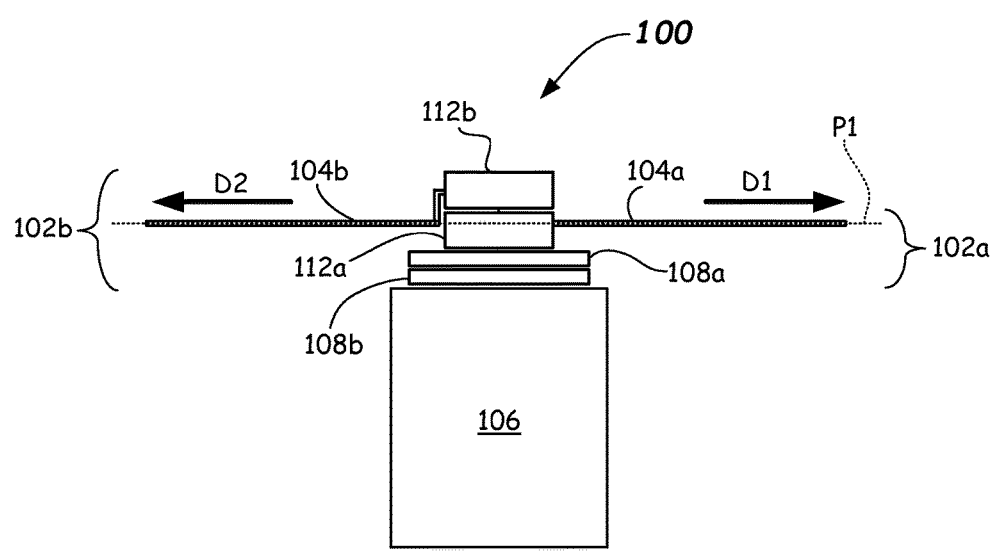
FIG. 1A illustrates a side view of a dual-blade robot according to one or more embodiments.

Referring to FIG. 1A, a first illustrative example embodiment of a dual-blade robot 100 is disclosed. Robot 100 is useful, and may be configured, to transfer substrates to and from various chambers, such as into and out of process chambers, and/or into and out of load lock chambers, for example. However, dual-blade robot 100 may be useful in other environments where compact size for a dual-blade robot is suitable. FIG. 1A shows example dual-blade robot 100 having a first frog-leg linkage 102a coupled to a first blade 104a and configured to extend first blade 104a in a first direction D1, and a second frog-leg linkage 102b coupled to a second blade 104b and configured to extend second blade 104b in a second direction D2, wherein second frog-leg linkage 102b is vertically offset from first frog-leg linkage 102a such that second frog-leg linkage 102b overlaps first frog-leg linkage 102a when first blade 104a and second blade 104b are each in a retracted position (as shown in FIG. 1A).

In some embodiments, dual-blade robot 100 is configured so that first blade 104a and second blade 104b are nominally coplanar (e.g., in some embodiments less than +/−1 degrees of tilt relative to each other and/or less than +/−1 mm vertically out of plane relative to each other). For example, first blade 104a and second blade 104b may be positioned so as to substantially extend and retract in the same plane P1. In some embodiments, second blade 104b may be shaped so that a supporting surface of second blade 104b is substantially in the same plane as a supporting surface of first blade 104a (as shown in FIG. 1A). In general, first blade 104a, second blade 104b, or both first and second blades 104a, 104b may be shaped so that first blade 104a and second blade 104b are nominally coplanar. Additionally or alternatively, one or more of first and second blades 104a, 104b may be positioned to be nominally coplanar through use of one or more adapters, brackets or the like.

Figure 1B:
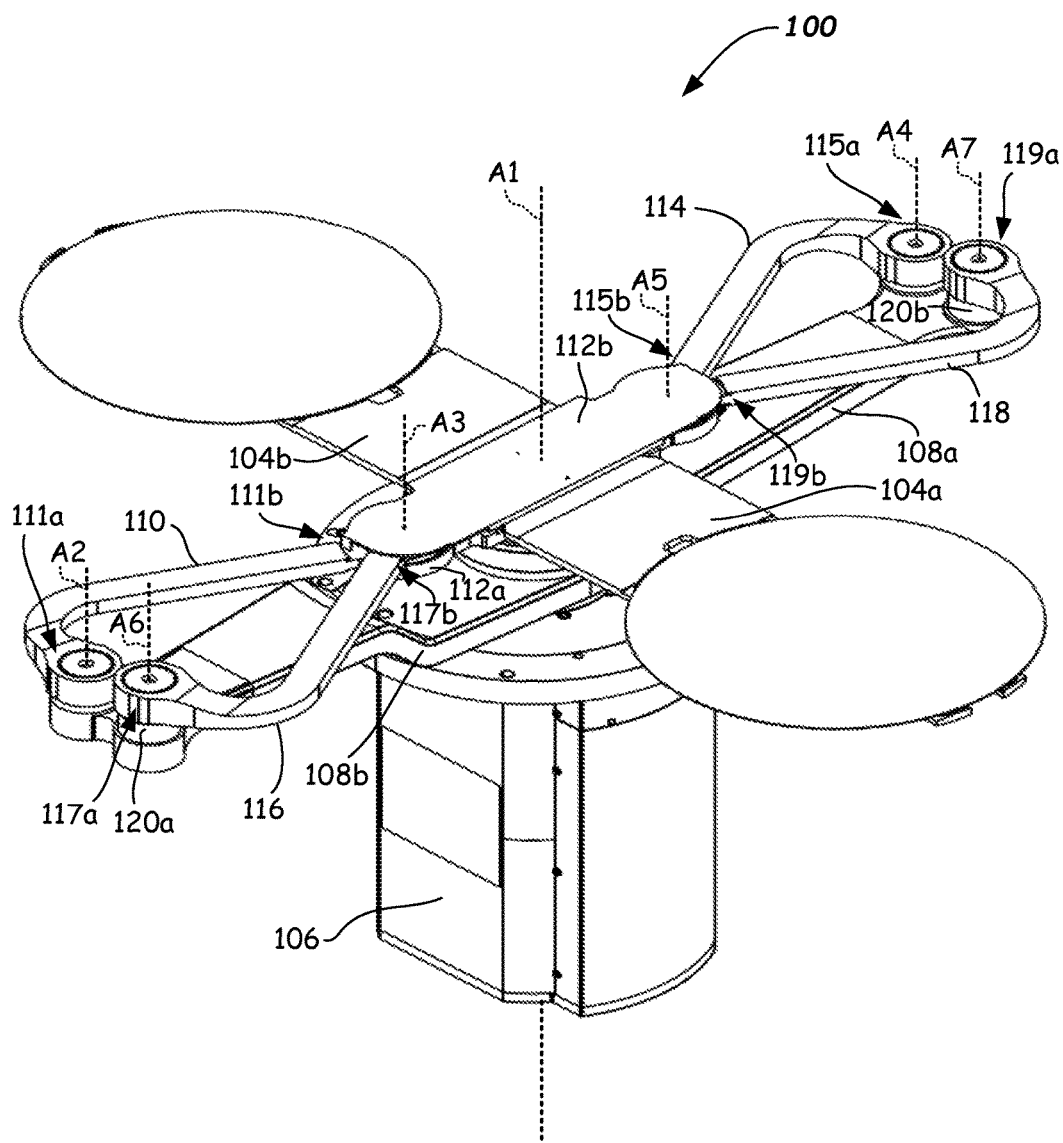
FIG. 1B illustrates an isometric view of a dual-blade robot according to one or more embodiments.

More particularly, an illustrative example embodiment of dual-blade robot 100 is shown in FIG. 1B. With reference to FIG. 1B, dual-blade robot 100 includes a hub 106 having a first axis A1. A first member 108a and a second member 108b are rotatably coupled to hub 106 at first axis A1. A first arm 110 has a first end 111a and a second end 111b, and its first end 111a is rotatably coupled to second member 108b at a second axis A2. Second end 111b of first arm 110 is rotatably coupled at a third axis A3 (of a bottom wrist connector 112a). A second arm 114, nominally coplanar with first arm 110, has a first end 115a and a second end 115b, and its first end 115a is rotatably coupled to first member 108a at a fourth axis A4. Second end 115b of second arm 114 is rotatably coupled at a fifth axis A5 (of bottom wrist connector 112a). A third arm 116 has a first end 117a and a second end 117b, and its first end 117a is rotatably coupled to second member 108b at a sixth axis A6. Second end 117b of third arm 116 is rotatably coupled at third axis A3 (of a top wrist connector 112b). A fourth arm 118, nominally coplanar with third arm 116, has a first end 119a and a second end 119b, and its first end 119a is rotatably coupled to first member 108a at a seventh axis A7. Second end 119b of fourth arm 118 is rotatably coupled at fifth axis A5 (of top wrist connector 112b).

As shown in FIG. 1B, third arm 116 is vertically offset from first arm 110, and fourth arm 118 is vertically offset from second arm 114. In some embodiments, this offset may range from about 1 to about 8 mm, although larger or smaller vertical offsets may be employed. The vertical offset may be provided, for example, by spacers 120a, 120b positioned underneath third arm 116 and/or fourth arm 118, respectively. Any other method for offsetting third arm 116 and/or fourth arm 118, may be employed. Spacers 120a, 120b may be formed from aluminum or another suitable material. As will be described further below, providing a vertical offset between first arm 110 and third arm 116, and second arm 114 and fourth arm 118, allows top wrist connector 112b to overlap bottom wrist connector 112a (see FIGS. 1A and 1B) so that first and second blades 104a and 104b may more fully retract. This allows dual-blade robot 100 to occupy a smaller footprint when fully retracted, as shown in FIGS. 1A and 1B.

Figure 1C:
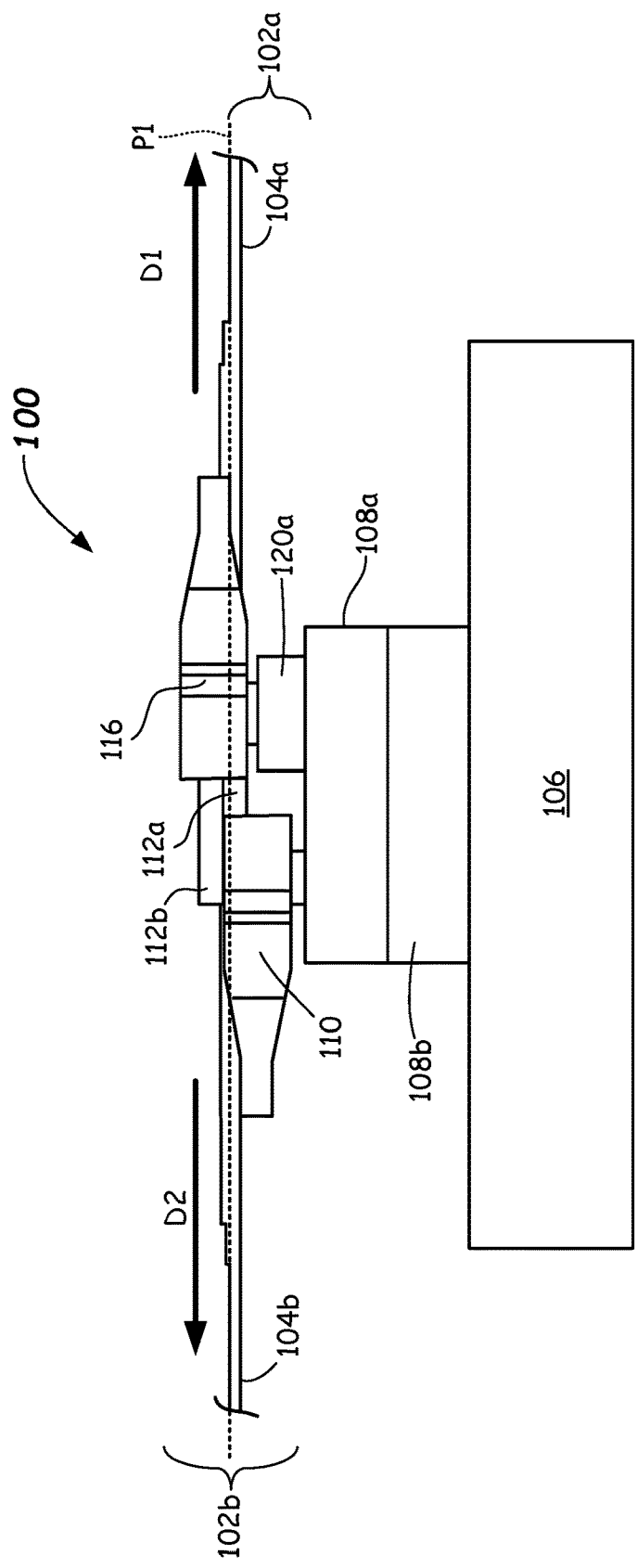
FIG. 1C illustrates a side view of a dual-blade robot in a retracted position in accordance with some embodiments.

FIG. 1C illustrates a side view of dual-blade robot 100 in a retracted position in accordance with some embodiments provided herein. With reference to FIG. 1C, top and bottom wrist connectors 112a, 112b are shown overlapping and are configured so that blades 104a, 104b are nominally coplanar (e.g., substantially extend and retract in the same plane P1). In some embodiments, first blade 104a is configured to extend outwardly from hub 106 in a first direction D1, second blade 104b is configured to extend outwardly from hub 106 in a second direction D2 different from first direction D1 (e.g., in opposite directions, although other directions may be used), and the first and second blades may be nominally coplanar. Further, first blade 104a is configured to retract inwardly toward hub 106, and second blade 104b is configured to retract inwardly toward hub 106.

Figure 1D:
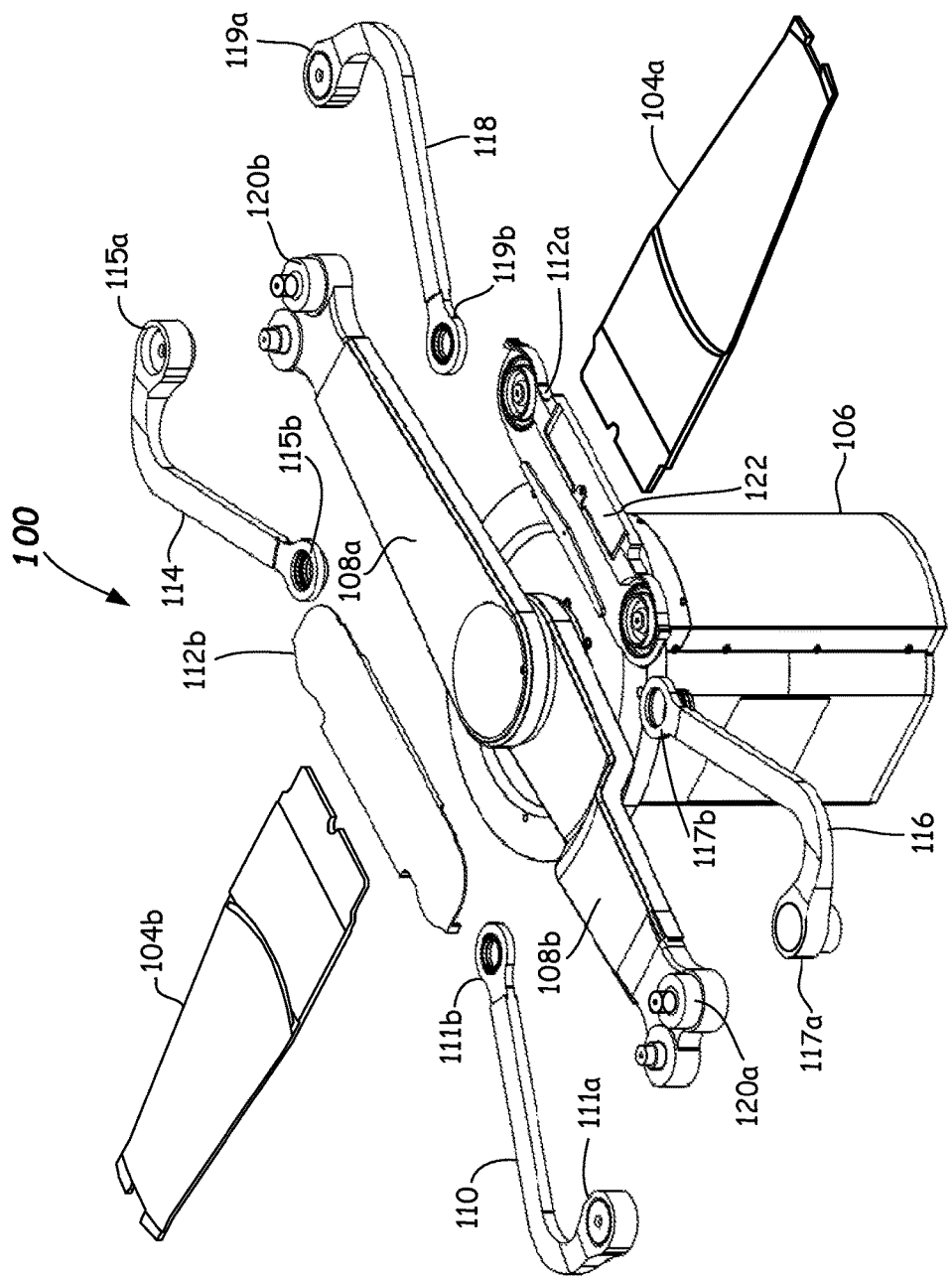
FIG. 1D illustrates an exploded view of a dual-blade robot in accordance with some embodiments.

FIG. 1D illustrates an exploded view of dual-blade robot 100 in accordance with some embodiments provided herein. With reference to FIG. 1D, in some embodiments, first arm 110 has an arcuate portion adjacent to its first end 111a, and a straight portion adjacent to its second end 111b. Second arm 114 has an arcuate portion adjacent to its first end 115a, and a straight portion adjacent to its second end 115b. Third arm 116 has an arcuate portion adjacent to its first end 117a, and a straight portion adjacent to its second end 117b. Fourth arm 118 has an arcuate portion adjacent to its first end 119a, and a straight portion adjacent to its second end 119b. Other arm portion shapes may be employed. As illustrated in FIG. 1D, wrist connectors 112a and 112b may be machined so that blades 104a, 104b are nominally coplanar when installed on dual-blade robot 100. For example, wrist connector 112a is provided with a pocket 122 in which blade 104a attaches. Wrist connector 112b may be similarly configured, and each pocket may have a depth that positions blades 104a and 104b so that they are nominally coplanar. Pocket depth may depend on such factors as height of the wrist connectors, 112a, 112b, vertical offset of the third and fourth arms 116 and 118, etc.

First blade 104a and second blade 104b may be formed from any suitable material or materials that comport with the intended use of the blades. In the illustrative example of FIGS. 1A and 1B, first blade 104a and second blade 104b are each comprised, at least in part, of quartz. It is noted that another term sometimes used to describe a blade is end effector.

Figure 2A:
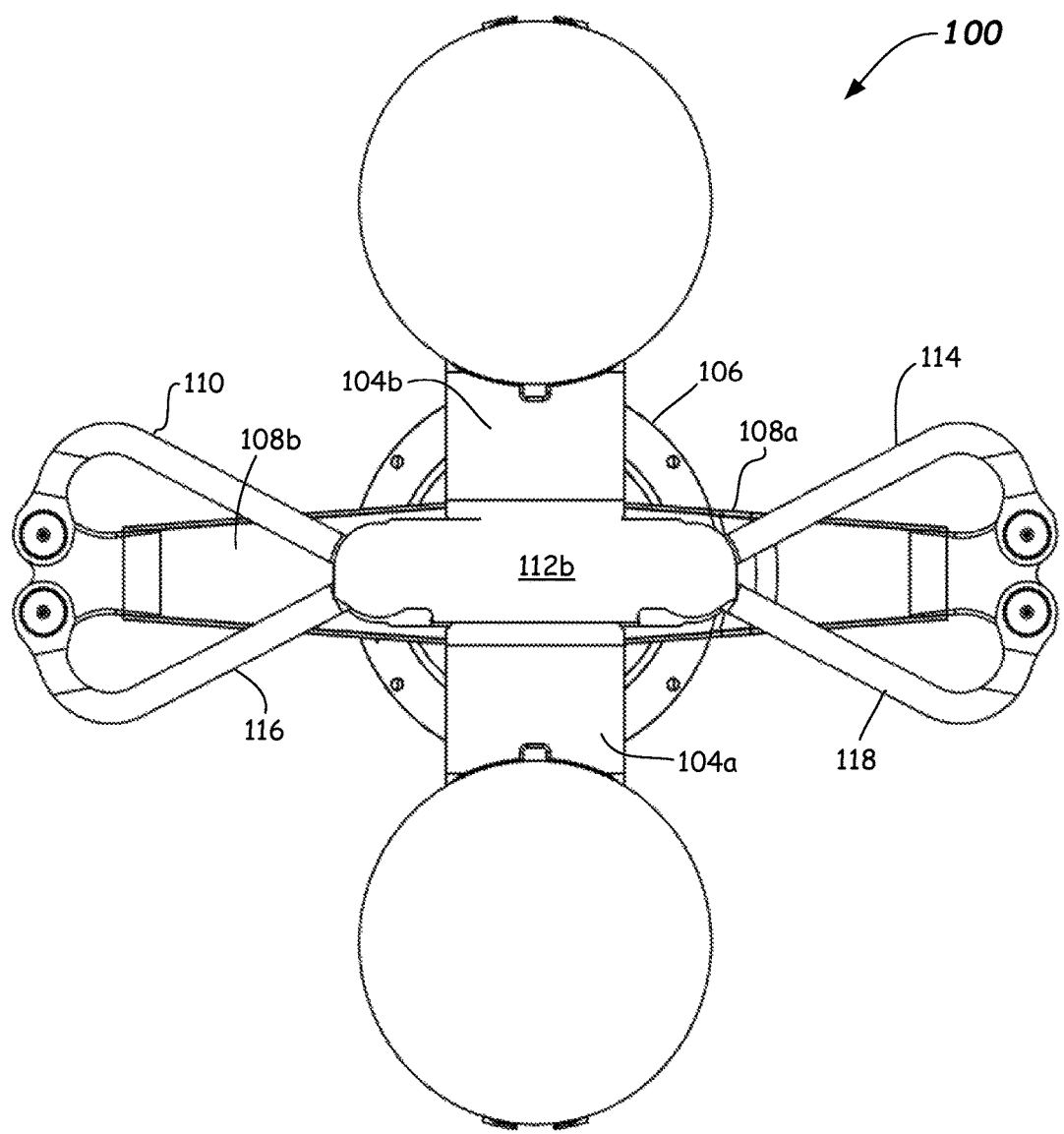
FIG. 2A illustrates a top plan view of a dual-blade robot according to one or more embodiments.
Figure 2B:
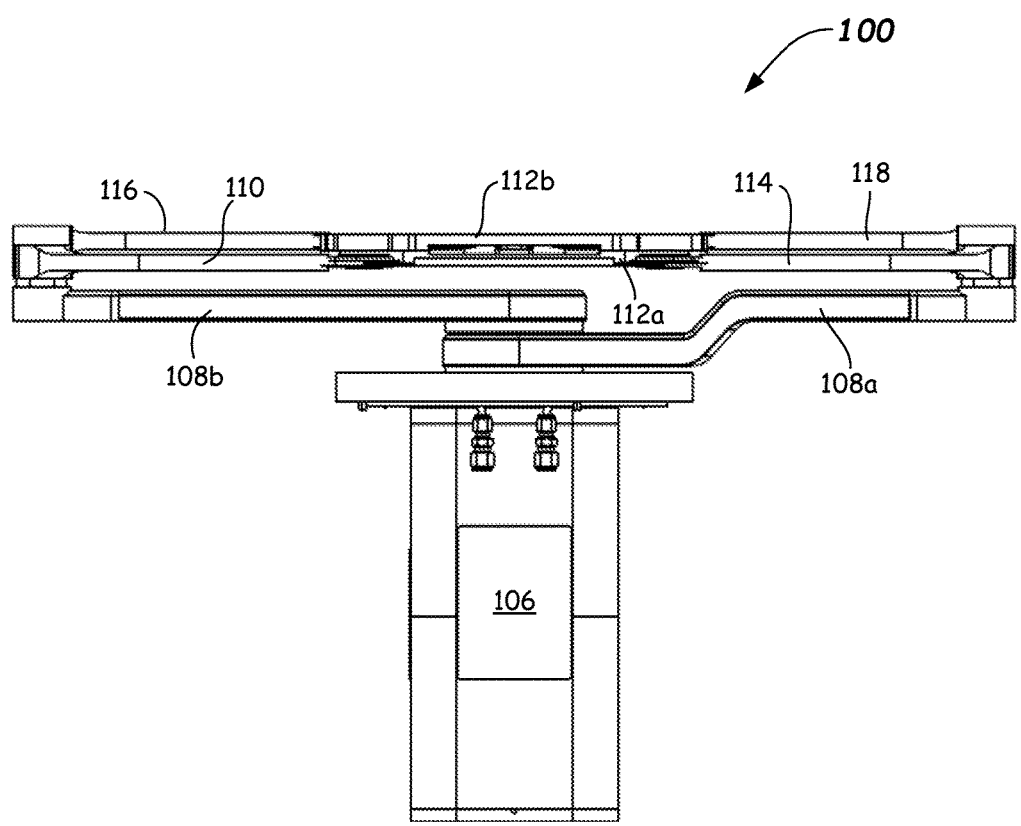
FIG. 2B illustrates a top plan view of a dual-blade robot according to one or more embodiments.

FIG. 2A illustrates a top plan view of the dual-blade robot 100, shown in isometric view in FIG. 1B, according to one or more embodiments of this disclosure. FIG. 2B illustrates a side view of dual-blade robot 100, shown in isometric view in FIG. 1B, according to one or more embodiments of this disclosure.

Figure 3:
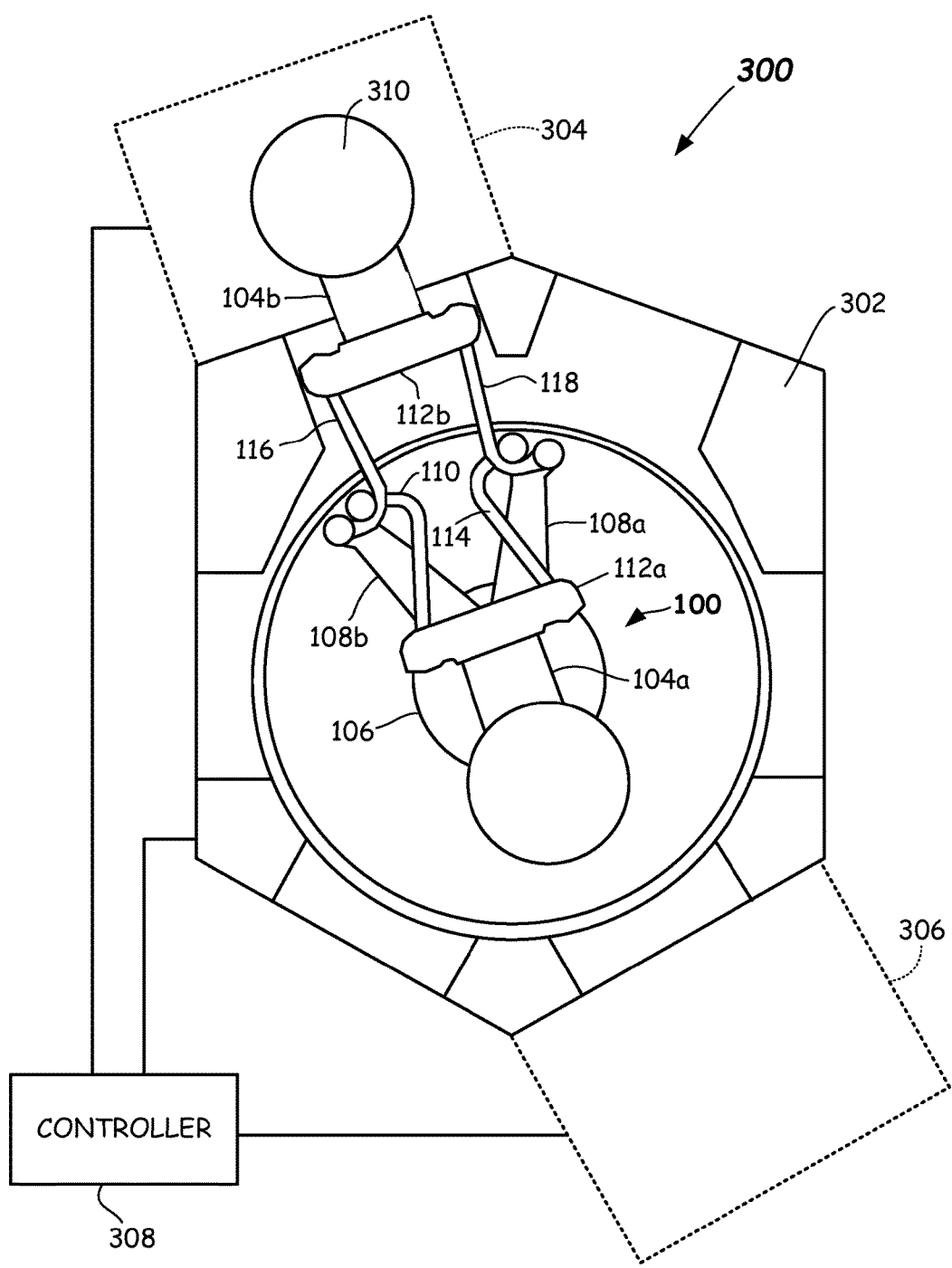
FIG. 3 illustrates an electronic device processing system including a dual-blade robot according to one or more embodiments.

An example embodiment of an electronic device processing tool 300 suitable for use with the dual-blade robot 100 of FIGS. 1A-2B, is shown in FIG. 3. FIG. 3 illustrates a schematic representation of an example embodiment of an electronic device processing tool 300, such as a cluster tool, that includes a transfer chamber 302, a load lock chamber 304 coupled to transfer chamber 302, a processing chamber 306 coupled to transfer chamber 302, dual-blade robot 100 disposed in transfer chamber 302, and a robot controller 308 coupled to dual-blade robot 100 (and/or transfer chamber 302, load lock chamber 304 and/or processing chamber 306).

Transfer chamber 302 may be configured to interface with at least one load lock chamber 304, interface with at least one processing chamber 306, and to house dual-blade robot 100. Transfer chamber 302 may be configured to be evacuated to a pressure less than standard atmospheric pressure, for example.

Load lock chamber 304 may be configured to interface with a factory interface (not shown) or other system component that may receive substrates from one or more substrate carriers (e.g., Front Opening Unified Pods (FOUPs)) docked at one or more load ports of the factory interface. Load lock chamber 304 may be configured to allow ingress and egress of a blade of dual-blade robot 100 for supplying substrates to or receiving substrates from processing chamber 306.

Processing chamber 306 may be configured for any suitable process operation, including but not limited to, etching, deposition, oxidation, nitridation, silicidation, epitaxial growth, selective epitaxial growth, resist stripping, cleaning, lithography, etc. Processing chamber 306 may be configured to allow ingress and egress of a blade of dual-blade robot 100.

As described above, dual-blade robot 100 may include a first frog-leg linkage coupled to a first blade and configured to extend the first blade in a first direction, and a second frog-leg linkage coupled to a second blade and configured to extend the second blade in a second direction, wherein the second frog-leg linkage is vertically offset from the first frog-leg linkage such that the second frog-leg linkage overlaps the first frog-leg linkage when the first blade and the second blade are each in a retracted position (see FIGS. 1A-2B, for example).

Robot controller 308 is coupled to dual-blade robot 100 and may be configured to provide control signals to dual-blade robot 100 that direct the operations thereof. Control signals generated by robot controller 308 may be, but are not limited to, electrical, optical, magnetic, and/or electromagnetic signals. In some example embodiments, robot controller 308 includes digital circuitry in the process of generating control signals. Such digital circuitry may include, but is not limited to, one or more microprocessors, one or more microcontrollers, one or more field programmable gate arrays (FPGA), one or more system on a chip (SoC) integrated circuits that include one or more embedded processors, or discrete digital components. Robot controller 308 may further include stored data and stored instructions for use by computational resources such as, but not limited to, a microprocessor, a microcontroller, and an embedded processor. Robot controller 308 may further include FPGA configuration data for dynamically modifying the functionality of the FPGA.

In some embodiments, robot controller 308 includes a network communications interface to facilitate maintenance and servicing of dual-blade robot 100, and to provide information on the operations and operational status of dual-blade robot 100.

In some embodiments, robot controller 308 is further configured to receive signals from dual-blade robot 100. Signals received by robot controller 308 from dual-blade robot 100 may be used by robot controller 308 to determine whether dual-blade robot 100 is operating in accordance with predetermined operating parameters. Robot controller 308 may be a dedicated for controller for controlling robot 100, or may be part of a controller and/or control system which controls cluster tool 300, transfer chamber 302, load lock chamber 304, and/or processing chamber 306.

Figure 4:
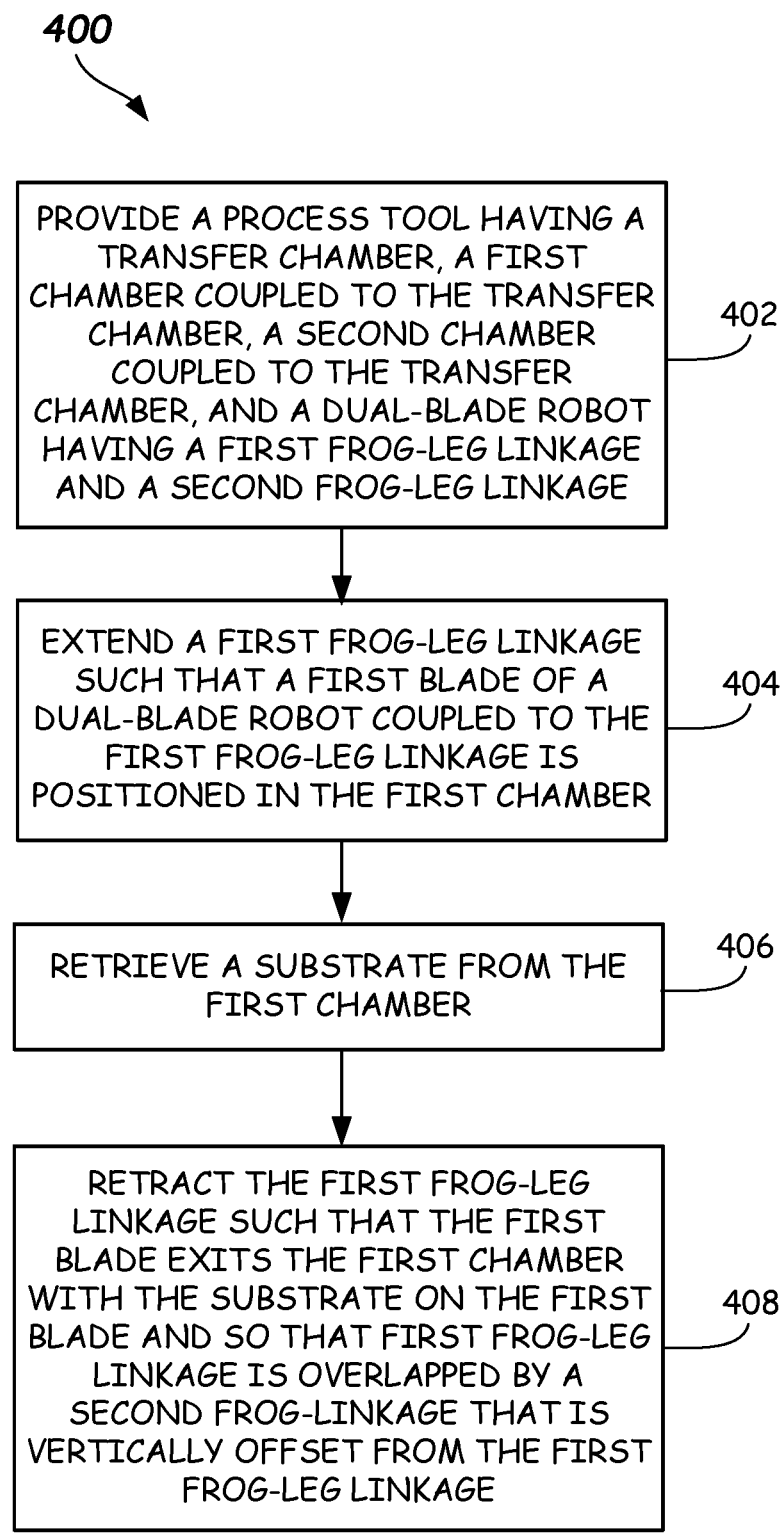
FIG. 4 illustrates a flowchart depicting a method of transferring a substrate between a first chamber and a second chamber according to one or more embodiments.

An example method 400 of transporting substrates within an electronic device processing system, for example a cluster tool, according to embodiments of this disclosure is provided and described with reference to FIG. 4. Method 400 includes providing at Block 402 a process tool having a transfer chamber, a first chamber coupled to the transfer chamber, a second chamber coupled to the transfer chamber, and a dual-blade robot having a first frog-leg linkage and a second frog-leg linkage (see, for example, processing tool 300 of FIG. 3).

Method 400 continues with Block 404 by extending a first frog-leg linkage, which is disposed in a transfer chamber, such that at least a portion of a first blade that is coupled to the first frog-leg linkage of a dual-blade robot is positioned in a first chamber that is coupled to the transfer chamber. In some example embodiments, the first chamber may be a load lock chamber or a process chamber. For example, with reference to FIG. 3, to extend second blade 104*b* into load lock chamber 304, first member 108*a* is rotated counterclockwise and second member 108*b* is rotated clockwise. This causes first arm 110, second arm 114, third arm 116 and fourth arm 118 to extend toward load lock chamber 304. As seen in FIG. 3, third arm 116 overlaps first arm 110 and fourth arm 118 overlaps second arm 114.

In the extended position of FIG. 3, wrist connector 112*b* is positioned near load lock chamber 304 so that second blade 104*b* extends into load lock chamber 304 (to either place a substrate within load lock chamber 304 or to retrieve a substrate from load lock chamber 304).

Method 400 continues with Block 406 by retrieving a substrate from the first chamber with the first blade. In some example embodiments, the substrate may be a wafer or a glass plate. Wafers may be of the type used in semiconductor manufacturing. Glass plates may be of the type used in display manufacturing or the like. In the example of FIG. 3, second blade 104*b* retrieves a substrate 310 from load lock chamber 304. In one or more embodiments, robot 100 may retrieve substrate 310 without vertical motion (e.g., load lock chamber 304 may index substrate 310 vertically to place substrate 310 on second blade 104*b*).

Method 400 continues with Block 408 by retracting the first frog-leg linkage such that the first blade, while supporting the substrate, exits the first chamber, and the first frog-leg linkage overlaps with a second frog-leg linkage of the dual-blade robot where the second frog-leg linkage is vertically offset from the first frog-leg linkage. For example, with reference to FIG. 3, after retrieving substrate 310 from load lock chamber 304, first member 108*a* may be rotated clockwise and second member 108*b* may be rotated counterclockwise. This causes first arm 110, second arm 114, third arm 116 and fourth arm 118 to retract toward hub 106 (as shown in FIG. 1B). As seen in FIG. 1B, third arm 116 overlaps first arm 110 and fourth arm 118 overlaps second arm 114. In the retracted position of FIG. 1B, wrist connector 112*b* is positioned above wrist connect 112*a* (see also FIG. 2B).

Similarly, first blade 104*a* may be extended into a load lock chamber or processing chamber by rotating first member 108*a* clockwise and second member 108*b* counterclockwise. This causes first arm 110, second arm 114, third arm 116 and fourth arm 118 to extend outwardly away from hub 106.

Further embodiments of this disclosure include operating the second blade to retrieve a substrate. For example, extending the second frog-leg linkage such that the second blade of the dual-blade robot coupled to the second frog-leg linkage is positioned in the first chamber, retrieving an additional substrate from the first chamber using the second blade, and retracting the second frog-leg linkage such that the second blade exits the first chamber with the additional substrate on the second blade. In the retracted position, the second frog-leg linkage overlaps the first frog-leg linkage from which it is vertically offset.

Example method 400 may be practiced with the follow example configuration of a cluster tool, but it will be appreciated that method 400 may be practiced with other electronic device processing systems. An example cluster tool configuration may include a transfer chamber in which a dual-blade robot is disposed. One or more load lock chambers may be coupled to the transfer chamber, and one or more process chambers may be coupled to the transfer chamber. One or more load lock chambers, one or more process chambers, and the transfer chamber may be configured to be evacuated. Such evacuation may facilitate low-pressure process operations. In various example embodiments, the first blade may be at least partly formed of quartz.

Example methods in accordance with the present disclosure may further include, after retrieving the substrate, rotating the first blade in a horizontal plane within the transfer chamber such that the first blade is aligned with a load lock chamber or a process chamber to which the substrate is to be delivered. In a manner similar to the method of retrieving the substrate, the substrate delivery may include extending the first frog-leg linkage such that the first blade is positioned in the chamber to which the substrate is to be delivered. After the substrate is delivered and removed from the first blade, the first blade is retracted by the retraction of the first frog-leg linkage.

In the example methods described above, the second frog-leg linkage operates to extend and retract a second blade of the dual-blade robot in the same manner as the first frog-leg linkage and the first blade. In example embodiments, the first blade and the second blade are nominally coplanar while the second frog-leg linkage is vertically offset from the first frog-leg linkage.

Thus a dual-blade robot having overlapping frog-leg linkages has been disclosed. The dual-blade robot includes first and second arms, coplanar with each other and each rotatably coupled to a first blade, in a frog-leg configuration, and third and fourth arms, coplanar with each other and each rotatably coupled to a second blade, in a frog-leg configuration, where the third and fourth arms are vertically offset from the first and second arms. The third and fourth arms are configured to overlap at least a portion of the first and second arms when the first and second blades are in a retracted position. Methods of operating the robot and electronic device processing systems including the robot are provided, as are numerous other aspects.

As should be apparent, dual-blade robot 100 as described herein, provides a compact arrangement thus advantageously allowing each of the two blades to be long and still fit within a transfer chamber (e.g., and allowing rotation of the robot and/or blades).

The foregoing description discloses only example embodiments. Modifications of the above-disclosed apparatus, systems, and methods which fall within the scope of the disclosure will be readily apparent to those of ordinary skill in the art. Accordingly, while the present disclosure has been provided in connection with example embodiments thereof, it should be understood that other embodiments may fall within the scope, as defined by the subjoined claims.

What is claimed is:

1. A dual-blade robot, comprising:
a first frog-leg linkage coupled to a first wrist connector and a first blade and configured to extend the first blade in a first direction; and
a second frog-leg linkage coupled to a second wrist connector and a second blade and configured to extend the second blade in a second direction opposite the first direction while the first blade is aligned in the first direction;
wherein the second frog-leg linkage is vertically offset from the first frog-leg linkage such that the second wrist connector overlaps the first wrist connector when the first blade and the second blade are each in a retracted position; and
wherein the first blade is oriented towards the first direction and the second blade is oriented towards the second direction while the first blade and the second blade are each in the retracted position.

2. The dual-blade robot of claim 1, further comprising:
a hub; and
a first member rotatably coupled to the hub; wherein the first frog-leg linkage is rotatably coupled to the first member at a first location, and the second frog-leg linkage is rotatably coupled to the first member at a second location.

3. The dual-blade robot of claim 1, wherein the first frog-leg linkage and the second frog-leg linkage are disposed within a first chamber.

4. A dual-blade robot, comprising:
a first frog-leg linkage coupled to a first blade and configured to extend the first blade in a first direction; and
a second frog-leg linkage coupled to a second blade and configured to extend the second blade in a second direction;
wherein the second frog-leg linkage is vertically offset from the first frog-leg linkage such that the second frog-leg linkage overlaps the first frog-leg linkage when the first blade and the second blade are each in a retracted position;
a hub having a first axis;
a first member rotatably coupled to the hub and rotatable about the first axis; and
a second member rotatably coupled to the hub and rotatable about the first axis;
wherein the first frog-leg linkage comprises:

a first arm having a first end and a second end, the first end of the first arm rotatably coupled to the first member and rotatable about a second axis, the second end of the first arm rotatably coupled to the first blade and rotatable about a third axis; and
a second arm having a first end and a second end, the first end of the second arm rotatably coupled to the second member and rotatable about a fourth axis, the second end of the second arm rotatably coupled to the first blade and rotatable about a fifth axis;
wherein the second frog-leg linkage comprises:
a third arm having a first end and a second end, the first end of the third arm rotatably coupled to the second member and rotatable about a sixth axis, the second end of the third arm rotatably coupled to the second blade and rotatable about the third axis; and
a fourth arm having a first end and a second end, the first end of the fourth arm rotatably coupled to the first member and rotatable about a seventh axis, the second end of the fourth arm rotatably coupled to the second blade and rotatable about the fifth axis;
wherein the first arm is nominally coplanar with the second arm, the third arm is nominally coplanar with the fourth arm, and the third and fourth arms are vertically offset from the first and second arms respectively.

5. The dual-blade robot of claim 4, wherein the first blade is configured to extend outwardly from the hub in the first direction, the second blade is configured to extend outwardly from the hub in the second direction different from the first direction, and the first and second blades are nominally coplanar.

6. The dual-blade robot of claim 4, wherein the first blade is configured to retract inwardly toward the hub, and the second blade is configured to retract inwardly toward the hub.

7. The dual-blade robot of claim 6, wherein the third arm is configured to overlap the first arm when the first blade and the second blade are each in a retracted position, and the fourth arm is configured to overlap the second arm when the first blade and the second blade are each in the retracted position.

8. The dual-blade robot of claim 4, wherein the first arm has an arcuate portion adjacent to the second axis and a straight portion adjacent to the third axis, the second arm has an arcuate portion adjacent to the fourth axis and a straight portion adjacent to the fifth axis, the third arm has an arcuate portion adjacent to the sixth axis and a straight portion adjacent to the third axis, and the fourth arm has an arcuate portion adjacent to the seventh axis and a straight portion adjacent to the fifth axis.

9. A cluster tool, comprising:
a transfer chamber;
a load lock coupled to the transfer chamber;
a process chamber coupled to the transfer chamber; and
a dual-blade robot having a first blade coupled to a first wrist connector and a second blade coupled to a second wrist connector, disposed within the transfer chamber, the dual-blade robot having a first frog-leg linkage and a second frog-leg linkage configured to extend the first blade in a first direction and to extend the second blade in a second direction opposite the first direction while the first blade is aligned in the first direction;
wherein the second frog-leg linkage is vertically offset from the first frog-leg linkage, and the second wrist connector overlaps the first wrist connector when the first frog leg linkage and the second frog-leg linkage are each in a retracted position; and wherein the first blade is oriented towards the first direction and the second blade is oriented towards the second direction while the first frog leg linkage and the second frog leg linkage are each in the retracted position.

10. The cluster tool of claim 9, wherein the first frog-leg linkage comprises:
a first arm having a first end and a second end, the first end of the first arm rotatably coupled to a first member and rotatable about a first axis, the second end of the first arm rotatably coupled to the first blade and rotatable about a second axis; and
a second arm having a first end and a second end, the first end of the second arm rotatably coupled to a second member and rotatable about a third axis, the second end of the second arm rotatably coupled to the first blade and rotatable about a fourth axis.

11. The cluster tool of claim 10, wherein the process chamber is configured for an epitaxial growth operation, and each of the first blade and the second blade comprise quartz.

12. The cluster tool of claim 9, wherein each of the load lock, the process chamber, and the transfer chamber are configured to be evacuated.

13. The cluster tool of claim 9, wherein the process chamber is configured for a low-pressure chemical vapor deposition operation.

14. A cluster tool, comprising:
a transfer chamber;
a load lock coupled to the transfer chamber; a process chamber coupled to the transfer chamber; and a dual-blade robot having a first blade and a second blade, disposed within the transfer chamber, the dual-blade robot having a first frog-leg linkage and a second frog-leg linkage;
wherein the second frog-leg linkage is vertically offset from the first frog-leg linkage, and the second frog-leg linkage overlaps the first frog-leg linkage when the first frog-leg linkage and the second frog-leg linkage are each in a retracted position;
wherein the first frog-leg linkage comprises:
a first arm having a first end and a second end, the first end of the first arm rotatably coupled to a first member and rotatable about a first axis, the second end of the first arm rotatably coupled to a first blade and rotatable about a second axis; and
a second arm having a first end and a second end, the first end of the second arm rotatably coupled to a second member and rotatable about a third axis, the second end of the second arm rotatably coupled to the first blade and rotatable about a fourth axis;
wherein the second frog-leg linkage comprises:
a third arm having a first end and a second end, the first end of the third arm rotatably coupled to the second member and rotatable about a fifth axis, the second end of the third arm rotatably coupled to a second blade and rotatable about the second axis; and
a fourth arm having a first end and a second end, the first end of the fourth arm rotatably coupled to the first member and rotatable about a sixth axis, the second end of the fourth arm rotatably coupled to the second blade and rotatable about the fourth axis;
wherein the first arm is nominally coplanar with the second arm, the third arm is nominally coplanar with the fourth arm, and the third and fourth arms are vertically offset from the first and second arms respectively, and the dual-blade robot is sized so as to allow rotation of the first and second blades within the transfer chamber about the first axis when the first and second blades are in a retracted position.

15. A method of transferring a substrate between a first chamber and a second chamber, comprising:
providing a process tool having:
a transfer chamber;
a first chamber coupled to the transfer chamber; a second chamber coupled to the transfer chamber; and
a dual-blade robot disposed within the transfer chamber, the dual-blade robot having a first frog-leg linkage coupled to a first wrist connector and a first blade and a second frog-leg linkage coupled to a second wrist connector and a second blade, the first frog-leg linkage configured to extend the first blade in a first direction and the second frog-leg linkage configured to extend the second blade in a second direction opposite the first direction while the first blade is aligned in the first direction;
extending the first frog-leg linkage such that a first blade of the dual-blade robot coupled to the first frog-leg linkage is positioned in the first chamber;
retrieving a substrate from the first chamber using the first blade; and
retracting the first frog-leg linkage such that the first blade exits the first chamber with the substrate on the first blade;
wherein the first wrist connector overlaps the second wrist connector of the dual-blade robot after the retracting of the first frog-leg linkage from the first chamber; and
wherein the first blade is oriented towards the first direction and the second blade is oriented towards the second direction after the retracting of the first frog-leg linkage from the first chamber.

16. The method of claim 15, wherein the substrate is a wafer.

17. The method of claim 15, further comprising: moving the first blade with the substrate thereon such that the first blade is aligned with the second chamber;
extending the first frog-leg linkage such that the first blade with the substrate thereon is positioned in the second chamber;
retracting the first frog-leg linkage such that the first blade exits the second chamber;
wherein the first frog-leg linkage overlaps the second frog-leg linkage of the dual-blade robot after the retracting of the first frog-leg linkage from the second chamber, and the substrate remains in the second chamber when the first blade exits the second chamber.

18. The method of claim 17, further comprising:
extending the second frog-leg linkage such that the second blade of the dual-blade robot coupled to the second frog-leg linkage is positioned in the first chamber;
retrieving an additional substrate from the first chamber using the second blade; and
retracting the second frog-leg linkage such that the second blade exits the first chamber with the additional substrate on the second blade.

19. The method of claim 15, wherein the first chamber is a load lock chamber, and the second chamber is a process chamber.

* * * * *